US008178193B2

United States Patent
Cho et al.

(10) Patent No.: US 8,178,193 B2
(45) Date of Patent: May 15, 2012

(54) CONSTRAINING GREEN SHEET AND METHOD OF MANUFACTURING MULTI-LAYER CERAMIC SUBSTRATE USING THE SAME

(75) Inventors: Beom Joon Cho, Gyunggi-do (KR); Jong Myeon Lee, Gyunggi-do (KR); Ho Sung Choo, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 51 days.

(21) Appl. No.: 12/260,042

(22) Filed: Oct. 28, 2008

(65) Prior Publication Data

US 2009/0110893 A1  Apr. 30, 2009

(30) Foreign Application Priority Data

Oct. 29, 2007  (KR) .................. 10-2007-0109040

(51) Int. Cl.
B32B 7/02 (2006.01)
B32B 37/06 (2006.01)
B32B 9/04 (2006.01)
(52) U.S. Cl. ...... 428/218; 428/220; 428/699; 156/89.11
(58) Field of Classification Search .................. 428/218, 428/699; 156/89.11
See application file for complete search history.

(56) References Cited

U.S. PATENT DOCUMENTS

2002/0155264 A1* 10/2002 Nishide et al. ................ 428/210
2003/0155455 A1*  8/2003 Hirano et al. .................. 241/23
2006/0234023 A1* 10/2006 Endou et al. .................. 428/210

FOREIGN PATENT DOCUMENTS

| JP | 7-30253 | 1/1995 |
| JP | 2006173456 A | * 6/2006 |
| JP | 2006-173456 | 6/2008 |
| KR | 2002-0090296 | 12/2002 |

OTHER PUBLICATIONS

Machine English Translation_JP_2006/173456, Kurihara, Difficult-to-Sintering Constraining Green Sheet, and Manufacturing Method of Multilayer Ceramic Substrate, Jun. 29, 2006, JPO, pp. 1-26.*

* cited by examiner

*Primary Examiner* — Angela Ortiz
*Assistant Examiner* — Tahseen N Khan
(74) *Attorney, Agent, or Firm* — McDermott Will & Emery, LLP

(57) ABSTRACT

Provided are a constraining green sheet and a method of manufacturing a multi-layer ceramic substrate. The constraining green sheet includes a first constraining layer and a second constraining layer. The first constraining layer has a side to be disposed on a multi-layer ceramic laminated structure and is formed of a first inorganic powder having a first particle diameter. The second constraining layer is disposed on top of the first constraining layer and is formed of a second inorganic powder having a second particle diameter larger than the first particle diameter. The second constraining layer is equal to or lower than the first constraining layer in terms of powder packing density. A shrinkage suppression rate can be increased and a de-binder passage can be secured in a firing process of the ceramic laminated structure by using the constraining green sheet formed of inorganic powders having different density and particle diameter.

2 Claims, 2 Drawing Sheets

CONSTRAINING GREEN SHEET AND METHOD OF MANUFACTURING MULTI-LAYER CERAMIC SUBSTRATE USING THE SAME

CROSS-REFERENCE TO RELATED APPLICATIONS

This application claims the priority of Korean Patent Application No. 2007-109040 filed on Oct. 29, 2007, in the Korean Intellectual Property Office, the disclosure of which is incorporated herein by reference.

BACKGROUND OF THE INVENTION

1. Field of the Invention

The present invention relates to a constraining green sheet and a method of manufacturing a multi-layer ceramic substrate using the same, and more particularly, to a constraining green sheet and a method of manufacturing a multi-layer ceramic substrate using the same, which can improve the firing characteristics by using inorganic powders that are different in terms of density and particle diameters.

2. Description of the Related Art

In general, a multi-layer ceramic substrate using glass-ceramic can provide implementation of a three-dimensional interlayer circuit and formation of cavities. Therefore, with high design flexibility, a multifunctional device can be installed in the multi-layer ceramic substrate.

Due to this, the practical use of multi-layer ceramic substrates is increasing gradually in the market of small-sized and high-functional high-frequency components. The early multi-layer ceramic substrate is manufactured by forming internal circuit patterns and via structures on a ceramic green sheet using conductive paste, laminating it to a desired thickness, and firing the resulting structure. In this process, because the multi-layer ceramic substrate undergoes a volume shrinkage of about 35% to about 50% and a lateral shrinkage is difficult to control, a dimensional error of about 0.5% occurs even in the same manufacturing stage as well as in the respective manufacturing stages.

A design margin of the internal circuit patterns and the via structures decreases with an increase in the structural complexity and fineness of the multi-layer ceramic substrate, thus requiring a non-shrinkage firing process that suppresses a lateral shrinkage of the multi-layer ceramic substrate.

To this end, a method is being widely used that suppresses a planar shrinkage by joining a flexible green sheet of poor-sinterable material, which is not fired at the firing temperature of the ceramic substrate material, onto one side or both sides of the multi-layer ceramic substrate. In particular, a load is applied to prevent a warpage of the ceramic substrate in a firing process. In this case, the firing characteristics may be degraded because a passage for a de-binder of organic materials is not secured in the firing process. Also, there may be a high residual carbon content in the sintered ceramic substrate, thus degrading the reliability of the ceramic substrate.

As a related art de-binder method, the Japanese Patent Laid-Open No. Hei 7-30253 discloses a method that can easily perform a de-binder process by perforating a constraining green sheet and filling the resulting hole with a resin, which is thermally decomposed more easily than an organic binder contained in a ceramic substrate, so that the de-binder operation of the ceramic substrate can be generated sufficiently even when the constraining green substrate is used. This method, however, is problematic in that it must additionally perforate the constraining layer and may cause a device deformation due to the resulting hole.

Also, the Korean Patent Laid-Open No. 2002-0090296 discloses a method that, by using an organic binder, which is lower in thermal decomposition initiation temperature than an organic binder of a device green sheet, for a constraining green sheet, first removes a binder of the constraining green sheet and easily discharges a binder of a device green layer through the resulting passage. However, in order to maximize the constraining force of the constraining green sheet, the contact point between the constraining layer and the ceramic laminated structure must be maximized by fining the powder of the constraining layer and increasing the content thereof. In this case, a blow hole in the constraining green sheet may fail to be sufficiently secured. If the blow hole fails to be sufficiently secured, even though the organic material of the constraining green sheet is first decomposed, it is difficult that a binder burned or decomposed from the ceramic laminated structure is discharged through the blow hole in the constraining green sheet by moving to a thickness of hundreds of microns, thus making it difficult to provide sufficient effects.

Also, in the Japanese Patent Laid-Open No. 2006-173456, as illustrated in FIG. 1, the volume content of an inorganic powder particle 12 and an organic binder 14 of a constraining green sheet 15 is larger in a close surface region 15a to a non-sintered multi-layer ceramic substrate 11 than in a free surface region 15b. That is, the joining force between the ceramic substrate and the constraining layer is increased so that a gradient of the organic material content is generated between the close surface and the free surface, and also a de-binder to the free surface with many blow holes is facilitated.

However, because a doctor blade process is used to form a component density gradient through precipitation in the constraining green sheet 15, it is difficult to guarantee the reproducibility of the volume content and the proper thicknesses of the respective regions. Also, the above method uses an inorganic powder with a large particle diameter (e.g., two or more times than the particle of the ceramic substrate) in order to precipitate the powder particles in the formation of the constraining green sheet and thus reduce the organic binder amount in the bottom thereof. Therefore, it is difficult to sufficiently secure the contact point with the ceramic substrate, and alto it is difficult to increase the capillary force that can move the organic binder from the ceramic substrate to the constraining green sheet.

SUMMARY OF THE INVENTION

An aspect of the present invention provides a constraining green sheet and a method of manufacturing a multi-layer ceramic substrate using the same, which can suppress a planar shrinkage of the ceramic substrate and improve the de-binder effects by firing the ceramic substrate by using a constraining green sheet formed of inorganic powders that are different in terms of density and particle diameter.

According to an aspect of the present invention, there is provided a constraining green sheet including: a first constraining layer that has a side to be disposed on a ceramic laminated structure and is formed of a first inorganic powder having a first particle diameter; and a second constraining layer that is disposed on the top of the first constraining layer and is formed of a second inorganic powder having a second particle diameter larger than the first particle diameter.

The first inorganic powder of the first constraining layer may have a first density, and the second inorganic powder of the second constraining layer may have a second density lower than the first density.

The second constraining layer may be equal to or lower than the first constraining layer in terms of the powder packing density.

The first density of the first inorganic powder may be about 1.5 or more times higher than the second density of the second inorganic powder. The second particle diameter of the second inorganic powder may be about 2 or more times larger than the first particle diameter of the first inorganic powder.

The first inorganic powder may be formed of at least one selected from the group consisting of cerium dioxide ($CeO_2$), zinc oxide ($ZnO_2$), and zirconia ($ZrO_2$). The second inorganic powder may be formed of at least one selected from the group consisting of alumina ($Al_2O_3$), magnesia (MgO), and boron nitride (BN).

According to another aspect of the present invention, there is provided a method of manufacturing a multi-layer ceramic substrate, the method including: preparing a non-sintered ceramic laminated structure formed of a plurality of ceramic green sheets; preparing one or more constraining green sheets including a first constraining layer formed of a first inorganic powder having a first particle diameter and a second constraining layer formed of a second inorganic powder having a second particle diameter larger than the first particle diameter; disposing the constraining green sheets on the top and the bottom of the ceramic laminated structure; and firing the ceramic laminated structure at a predetermined firing temperature.

The first inorganic powder of the first constraining layer may have a first density, and the second inorganic powder of the second constraining layer may have a second density lower than the first density.

The second constraining layer may be equal to or lower than the first constraining layer in terms of the powder packing density.

The preparing of the constraining green sheets may include: forming a slurry by adding an organic binder to a mixed powder of the first inorganic powder and the second inorganic powder; and coating the slurry.

The coating of the slurry may move, by a density difference, the first inorganic powder with the first density downward to form the first constraining layer, and move the second inorganic powder with the second density upward to form the second constraining layer.

The first density of the first inorganic powder may be about 1.5 or more times higher than the second density of the second inorganic powder. The second particle diameter of the second inorganic powder may be about 2 or more times larger than the first particle diameter of the first inorganic powder.

The first inorganic powder may be formed of at least one selected from the group consisting of cerium dioxide ($CeO_2$), zinc oxide ($ZnO_2$), and zirconia ($ZrO_2$).

The second inorganic powder may be formed of at least one selected from the group consisting of alumina ($Al_2O_3$), magnesia (MgO), and boron nitride (BN).

The method may further include: removing the constraining green sheets from the top and the bottom of the ceramic laminated structure after completion of the firing of the ceramic laminated structure; and forming an external electrode on the ceramic laminated structure.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
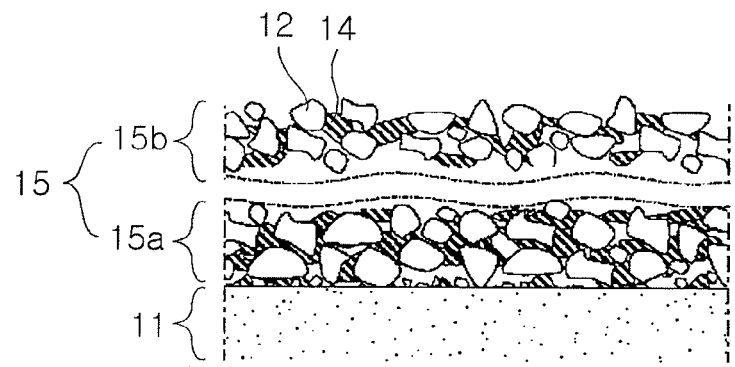
FIG. 1 is a vertical cross-sectional view illustrating an example of a poor-sinterable constraining green sheet according to the related art.
Figure 2:
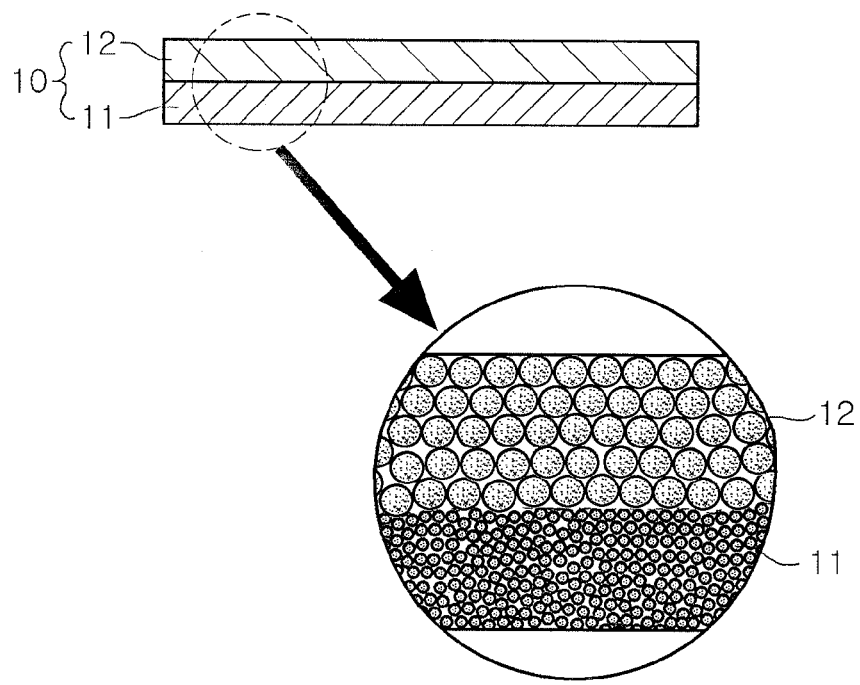
FIG. 2 is a vertical cross-sectional view illustrating the structure of a constraining green sheet according to an embodiment of the present invention.

FIG. 2 is a vertical cross-sectional view illustrating the structure of a constraining green sheet according to an embodiment of the present invention.

Referring to FIG. 2, a constraining green sheet 10 according to an embodiment of the present invention includes a first constraining layer 11 and a second constraining layer 12. In this case, one side of the first constraining layer 11 is disposed on the top or bottom of a ceramic laminated structure (not illustrated), and the other side of the first constraining layer 11 is joined to the second constraining layer 12.

The first constraining layer 11 is formed of a first inorganic material that has a first density and a first particle diameter, and the second constraining layer 12 is formed of a second inorganic material that has a second density lower than the first density and a second particle diameter larger than the first particle diameter. This can be clearly seen from an expanded view of a portion of the constraining green sheet 10. Referring to the expanded view, the first constraining layer 11 is formed of a first inorganic powder with a small particle diameter, and the second constraining layer 12 is formed of a second inorganic powder with a large particle diameter. In this case, the second constraining layer 12 is equal to or lower than the first constraining layer 11 in terms of the powder filling density.

Accordingly, the contact point between the first inorganic powder and the ceramic laminated structure increases when one side of the first constraining layer 11 is disposed on the ceramic laminated structure. Also, spaces are formed between the second inorganic powder particles due to the relatively large particle diameter of the second constraining layer 12. Consequently, an increase in the contact point between the first constraining layer 11 and the ceramic laminated structure increases a shrinkage suppression rate and a capillary force, so that the organic material in the ceramic laminated structure can be easily infiltrated into the first constraining layer 11. Also, the organic material infiltrated into the first constraining layer 11 can be discharged outside the second constraining layer 12, using the spaces between the second inorganic powder particles as a de-binder passage.

In this way, the first inorganic powder and the second inorganic powder must include materials different in terms of density and particle diameter in order to increase the shrinkage suppression effect of the ceramic laminated structure and secure the de-binder passage. Preferably, the second particle diameter of the second inorganic powder is about 2 or more times larger than the first particle diameter of the first inorganic powder, and the first density of the first inorganic powder is about 1.5 or more times higher than the second density of the second inorganic powder.

Table 1 below shows materials that can be used as the first inorganic powder and the second inorganic powder.

TABLE 1

| First inorganic powder | | Second inorganic powder | |
|---|---|---|---|
| Material | Density [g/cm$^3$] | Material | Density [g/cm$^3$] |
| $ZrO_2$ | 5.73 | BN | 3.48 |
| $SnO_2$ | 6.95 | MgO | 3.77 |
| $CeO_2$ | 7.30 | $Al_2O_3$ | 3.95 |

Referring to Table 1, the manufacturer can suitably select materials that are to be used as the first inorganic powder and the second inorganic powder. The materials shown in Table 1 are poor-sinterable materials that are not fired at the firing temperature of the ceramic laminated structure.

For example, cerium dioxide ($CeO_2$) having a density of about 7.30 g/cm$^3$ and a particle diameter of about 1.0 μm is used as the first inorganic powder, and alumina ($Al_2O_3$) having a density of about 3.95 g/cm$^3$ and a particle diameter of about 4.0 μm is used as the second inorganic powder. In this case, the cerium dioxide powder and the alumina powder satisfy the conditions for the densities and the particle diameters of the first inorganic powder and the second inorganic powder. A method for manufacturing the constraining green sheet using the cerium dioxide powder and the alumina powder will be described in detail below.

Figure 3:
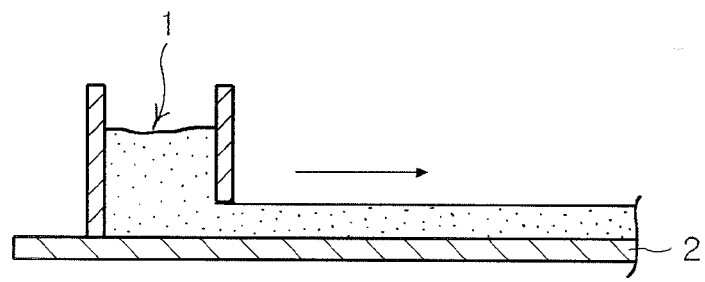
FIG. 3 is a schematic diagram illustrating a method for manufacturing the constraining green sheet of FIG. 2 by using a doctor blade process.

FIG. 3 is a schematic diagram illustrating a method for manufacturing the constraining green sheet 10 of FIG. 2 by using a doctor blade process.

First, the cerium dioxide powder for the first inorganic powder and the alumina powder for the second inorganic powder are mixed at a ratio of about 4:6 to form a mixed powder. Thereafter, an about 15 wt % acryl-based binder, an about 0.5 wt % dispersant, and a mixed solvent of toluene and ethanol are added to the 100% mixed powder to form a slurry 1. Thereafter, the slurry 1 is coated on a PET film 2 of a doctor blade apparatus to manufacture the constraining green sheet 10.

In this case, in a drying process of the slurry 1 coated on the PED film 2, by a density difference, the cerium dioxide powder with a relatively high density (about 7.30 g/cm$^3$) moves to the bottom of the constraining green sheet 10 and the alumina powder with a relatively small density (about 3.95 g/cm$^3$) moves to the top of the constraining green sheet 10. Accordingly, the cerium dioxide powder is dried to form the first constraining layer 11 and the alumina powder is dried to form the second constraining layer 12. In this case, the constraining green sheet 10 may be manufactured in plurality so that they are laminated on the top or bottom of the ceramic laminated structure.

Figure 4A:
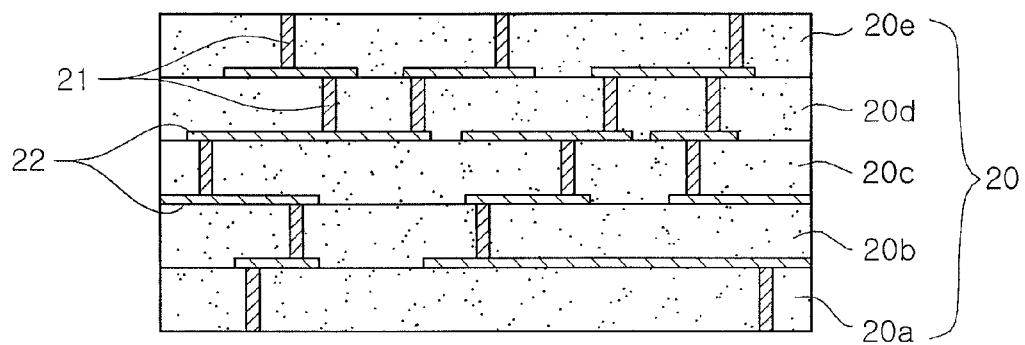
FIGS. 4A to 4C are vertical cross-sectional views illustrating a method for manufacturing a multi-layer ceramic substrate by using the constraining green sheet of FIG. 2.
Figure 4B:
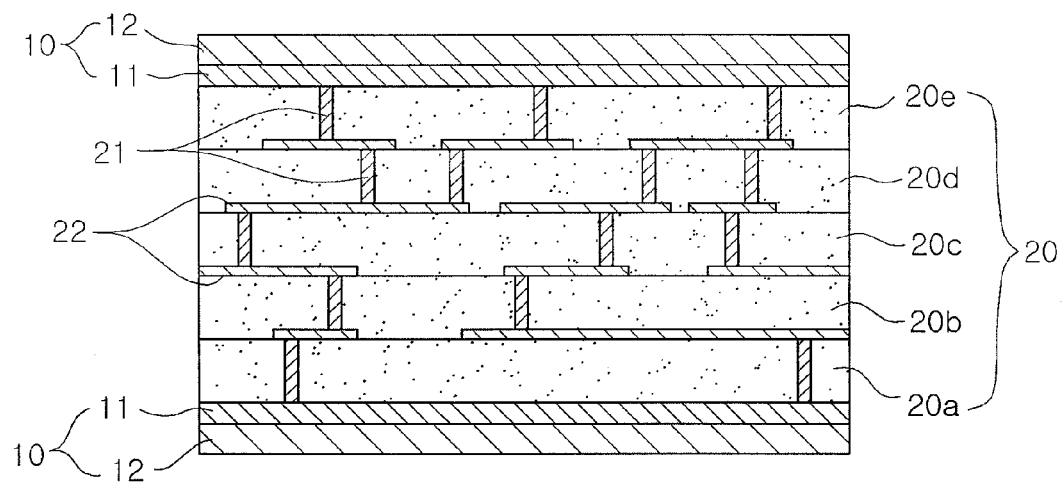
Figure 4C:
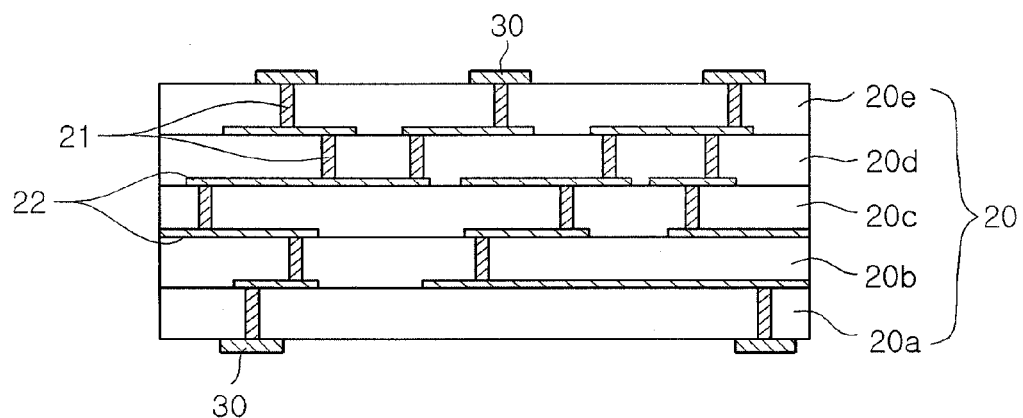

FIGS. 4A to 4C are vertical cross-sectional views illustrating a method for manufacturing a multi-layer ceramic substrate according to an embodiment of the present invention by using the constraining green sheet 10 of FIG. 2.

Referring to FIG. 4A, a plurality of ceramic green sheets 20a, 20b, 20c, 20d and 20e are laminated to prepare a ceramic laminated structure 20. In this case, each of the ceramic green sheets 20a, 20b, 20c, 20d and 20e may be formed through a suitable well-known process by using a mixture of an organic material such as an organic binder and a sintering glass-ceramic powder that can be fired at a low temperature. In this case, an internal circuit pattern may be formed in the ceramic laminated structure 20 by forming via holes 21 in the ceramic green sheets 20a, 20b, 20c, 20d and 20e and then filling the via holes 21 with a conductive paste, or by screen-printing a conductive paste on the ceramic green sheets 20a, 20b, 20c, 20d and 20e to form internal electrodes 22. The ceramic green sheets 20a, 20b, 20c, 20d and 20e formed in the above way are laminated to prepare the ceramic laminated structure 20 as illustrated in FIG. 4A. Although FIG. 4A illustrates that the five the ceramic green sheets 20a, 20b, 20c, 20d and 20e are laminated to prepare the ceramic laminated structure 20, the number of the ceramic green sheets may vary according to embodiments.

Referring to FIG. 4B, constraining green sheets 10 are laminated on the top and bottom of the ceramic laminated structure 20, and the laminated constraining green sheets 10 are fired. In this case, each of the laminated constraining green sheets 10 may be the constraining green sheet 10 illustrated in FIG. 2. That is, each of the laminated constraining green sheets 10 may include a first constraining layer 11 and a second constraining layer 12, and one side of the first constraining layer 11 may be disposed on the top or bottom of the ceramic laminated structure 20.

The first constraining layer 11 is formed of a first inorganic powder that has a first density and a first particle diameter, and the second constraining layer 12 is formed of a second inorganic powder that has a second density and a second particle diameter. In this case, in addition to the inorganic powder, an organic binder, a dispersant, and a solvent may be added to each of the constraining layers 11 and 12. According to an embodiment of the present invention, the first density of the first inorganic powder is about 1.5 or more times higher than the second density of the second inorganic powder, and the second particle diameter of the second inorganic powder is about 2 or more times larger than the first particle diameter of the first inorganic powder.

The constraining green sheet 10 may be laminated on one of the top and the bottom of the ceramic laminated structure 20, or may be laminated on both of the top and the bottom of the ceramic laminated structure 20 in order to provide effective shrinkage suppression. Also, after lamination of the constraining green sheet 10, a pressure of about 300 Kgf/cm$^2$ is applied at a temperature of about 85° C. to unify the ceramic laminated structure 20 and the constraining green sheets 10. Thereafter, the ceramic laminated structure 20 laminated with the constraining green sheets 10 is fired under predetermined firing conditions.

Referring to FIG. 4C, after completion of the firing process, the constraining green sheets 10 are removed from the ceramic laminated structure 20. In this case, the constraining green sheets can be removed in the shape of powder because they are not fired. Also, the ceramic laminated structure 20 was shrunk only in the thickness direction (i.e., the longitudinal direction), but was little shrunk in the surface direction (i.e., the lateral direction).

A conductive paste is screen-printed on the top and bottom of the ceramic laminated structure 20 to form external electrodes 30, thereby manufacturing the multi-layer ceramic substrate.

Hereinafter, a description will be given of the characteristics of a multi-layer ceramic substrate manufactured according to an embodiment of the present invention and the characteristics of multi-layer ceramic substrates manufactured according to comparative examples different from the embodiment of the present invention.

[Fabrication of Non-Sintered Multi-Layer Ceramic Substrate]

A 15 wt % acryl-based binder, a 0.5 wt % dispersion, and a mixed solvent of toluene and ethanol are added to a 100% glass-ceramic powder, and a ball mill is used to perform a dispersion process. The resulting slurry is filtered, bubbles are removed, and a doctor blade process is used to form a ceramic green sheet with a thickness of 50 μm. The ceramic green sheet is cut in a predetermined size, a screen printing process is used to form a predetermined electrode pattern, and the layer 20 is pressed and laminated to fabricate a unified non-sintered multi-layer ceramic laminated structure.

For comparison of the shrinkage ratios and the removal characteristics depending on the types of the binder in the ceramic laminated structure, in addition to the acryl-based binder, a PVB-based binder was used to fabricate a non-sintered multi-layer ceramic laminated structure in the same way as described above.

[Fabrication of Constraining Green Sheet]

Table 2 below shows the conditions for the respective types of constraining green sheets according to an embodiment of the present invention, a comparative example 1, and another comparative example 2. In accordance with the above conditions, the constraining green sheets necessary for the embodiment, the comparative example 1, and the comparative example 2 are fabricated as follows.

EMBODIMENT

A constraining green sheet including a first constraining layer and a second constraining layer is fabricated as a constraining green sheet corresponding to the conditions of the present invention. A mixed powder of a cerium dioxide ($CeO_2$) powder having a first density of 7.30 $g/cm^3$ and a first particle diameter of 1.0 μm and an alumina ($Al_2O_3$) powder having a second density of 3.95 $g/cm^3$ and a second particle diameter of 4.0 μm is used to fabricate a constraining green sheet 10 with a thickness of 150 μm. In this case, a 15 wt % acryl-based binder, a 0.5 wt % dispersion, and a mixed solvent of toluene and ethanol are added to a 100% glass-ceramic powder, and a ball mill is used to perform a dispersion process. The resulting slurry is filtered, bubbles are removed, and a doctor blade process is used to form a constraining green sheet with a thickness of 150 μm. In a slurry drying process, the cerium dioxide powder with the first density moves to the bottom of the constraining green sheet to form a first constraining layer 11, and the alumina powder with the second density moves to the top of the constraining green sheet to form a second constraining layer 12.

COMPARATIVE EXAMPLE 1

For a comparative experiment with respect to the embodiment of the present invention, instead of using a mixture of inorganic powders different in terms of density and particle diameter, only an alumina powder having a density of 3.95 $g/cm^3$ and a particle diameter of 4.0 μm is used to fabricate an alumina constraining green sheet with a thickness of 150 μm.

COMPARATIVE EXAMPLE 2

Also, for comparison with the embodiment of the present invention, instead of using a mixture of inorganic powders different in terms of density and particle diameter, only a cerium dioxide powder having a density of 7.30 $g/cm^3$ and a particle diameter of 1.0 μm is used to fabricate a cerium dioxide constraining green sheet with a thickness of 150 μm.

The same organic binder, dispersion, mixed solvent and manufacturing process as in the embodiment of the present invention are used to fabricate the constraining green sheets of the comparative example 1 and the comparative example 2.

TABLE 2

| | First inorganic powder Cerium dioxide | | Second inorganic Powder Alumina | |
|---|---|---|---|---|
| | Density [$g/cm^3$] | Diameter [μm] | Density [$g/cm^3$] | Diameter [μm] |
| Embodiment of invention | 7.30 | 1.0 | 3.95 | 4.0 |
| Comparative example 1 | — | — | 3.95 | 4.0 |
| Comparative example 2 | 7.30 | 1.0 | — | — |

[Joining of Ceramic Laminated Structure and Constraining Green Sheet]

Two constraining green sheets with a thickness of 150 μm cut in the same area as the non-sintered ceramic laminated structure are attached to each of the top and the bottom of the non-sintered ceramic substrate, and a thermal compression process is performed under a pressure of 300 kgf/$cm^2$ at a temperature of 85° C. to fabricate a unified laminated structure.

Two constraining green sheets fabricated under the conditions shown in Table 2 are used. In particular, the constraining green sheet fabricated using a mixture of a first inorganic powder and a second inorganic powder different in terms of density and particle diameter is used in the embodiment of the present invention. The experiment is performed on two types of ceramic laminated structures that respectively use an acryl-based binder and a PVB-based binder.

[De-Binder and Sintering]

The temperature is increased at a rate of 60° C./hour from the normal temperature to 420° C. causing decomposition of organic material, and the temperature of 420° C. is maintained for 2 hours in order to secure a sufficient de-binder time. After completion of the de-binder process, the temperature is increased at a rate of 300° C./hour to a firing temperature of 870° C., and the temperature of 870° C. is maintained for 30 minutes to perform a sintering process. After completion of the sintering process, the temperature is decreased to the room temperature to obtain a sintered structure.

The constraining green sheet is removed from the sintered structure, and the shrinkage ratio and the residual carbon content of the ceramic laminated structure are measured. Table 3 below shows the firing results of the multi-layer ceramic substrates manufactured using the constraining green sheets according to the embodiment, the comparative example 1, and the comparative example 2.

TABLE 3

| | First ceramic substrate (Acryl-based binder) | | Second ceramic substrate (PVB-based binder) | |
|---|---|---|---|---|
| | Residual carbon content [ppm] | Shrinkage ratio [%] | Residual carbon content [ppm] | Shrinkage ratio [%] |
| Embodiment of invention | 53 | 0.28 | 106 | 0.32 |
| Comparative example 1 | 51 | 0.38 | 103 | 0.41 |
| Comparative example 2 | 62 | 0.28 | 124 | 0.33 |

It can be seen from Table 3 that the creaming laminated structure containing the acryl-based binder has more effective de-binder characteristics than the ceramic laminated structure containing the PVB-based binder.

Referring to the comparative example 1 of Table 3, when the alumina powder with a relative large particle diameter is used for the constraining green sheet, the de-binder passage for organic material is secured and the residual carbon content is low. However, due to the alumina powder with a large particle diameter, the contact point between the constraining green sheet and the ceramic laminated structure is reduced and the shrinkage ratio is high. Also, because the comparative example 2 of Table 3 uses the cerium dioxide powder with a small particle diameter for the constraining green sheet, the shrinkage ratio of the ceramic laminated structure is low but the de-binder passage is not secured and thus the residual carbon content is high.

However, in the case of the ceramic substrate according to the embodiment of the present invention, the shrinkage ratio of the ceramic laminated structure is low due to the cerium dioxide powder with a small particle diameter and the de-binder passage is secured due to the alumina powder with a large particle diameter and thus the residual carbon content is low.

In conclusion, the embodiment of the present invention, which uses the constraining green sheet fabricated using the first inorganic material and the second inorganic material different in terms of density and particle diameter in order to secure the de-binder passage and achieve the shrinkage suppression effects for the ceramic laminated structure, provides the most improved results.

As described above, the present invention can effectively suppress a planar shrinkage of the ceramic laminated structure and can easily secure a passage for a de-binder of organic materials in the firing process by using the constraining green sheet formed of inorganic powders that are different in terms of density and particle diameter. Accordingly, the reliability of the multi-layer ceramic substrate can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A poor-sinterable constraining green sheet to be disposed on the top or bottom of a non-sintered ceramic laminated structure, the constraining green sheet comprising:
    a first constraining layer that has a side to be disposed on the ceramic laminated structure and is formed of a first inorganic powder having a first particle diameter; and
    a second constraining layer that is disposed on the top of the first constraining layer to be exposed to the outside and is formed of a second inorganic powder having a second particle diameter larger than the first particle diameter,
    wherein the second constraining layer is lower than the first constraining layer in terms of powder packing density,
    wherein the second particle diameter of the second inorganic powder is about two or more times larger than the first particle diameter of the first inorganic powder so that a de-binder passage can be secured in a firing process,
    the first inorganic powder of the first constraining layer has a first density, and the second inorganic powder of the second constraining layer has a second density lower than the first density,
    the first inorganic powder is formed of at least one selected from the group consisting of cerium dioxide ($CeO_2$), zinc oxide ($ZnO_2$), and zirconia ($ZrO_2$), and
    the second inorganic powder is formed of at least one selected from the group consisting of alumina ($Al_2O_3$), magnesia (MgO), and boron nitride (BN).

2. The constraining green sheet of claim 1, wherein the first density of the first inorganic powder is about 1.5 or more times higher than the second density of the second inorganic powder.

* * * * *